(12) United States Patent
Toyoda

(10) Patent No.: US 9,318,433 B2
(45) Date of Patent: Apr. 19, 2016

(54) SEMICONDUCTOR DEVICE

(71) Applicant: FUJI ELECTRIC CO., LTD., Kawasaki-shi (JP)

(72) Inventor: Yoshiaki Toyoda, Matsumoto (JP)

(73) Assignee: FUJI ELECTRIC CO., LTD., Kawasaki-shi (JP)

(*) Notice: Subject to any disclaimer, the term of this patent is extended or adjusted under 35 U.S.C. 154(b) by 120 days.

(21) Appl. No.: 14/249,561

(22) Filed: Apr. 10, 2014

(65) Prior Publication Data

US 2014/0306750 A1 Oct. 16, 2014

(30) Foreign Application Priority Data

Apr. 16, 2013 (JP) ................................. 2013-085699

(51) Int. Cl.
*H01H 37/76* (2006.01)
*H01H 85/00* (2006.01)
*H01L 23/525* (2006.01)

(52) U.S. Cl.
CPC ..... *H01L 23/5256* (2013.01); *H01L 2924/0002* (2013.01)

(58) Field of Classification Search
CPC ...... G11C 17/18; G11C 17/16; G11C 29/785; H01L 23/5256; H01L 23/5252
USPC ....................... 327/526; 365/225.7
See application file for complete search history.

(56) References Cited

U.S. PATENT DOCUMENTS

| 5,173,616 | A | * | 12/1992 | Hinooka | 327/525 |
| 6,570,433 | B2 | * | 5/2003 | Aipperspach et al. | 327/525 |
| 8,071,437 | B2 | * | 12/2011 | Lin et al. | 438/238 |
| 8,610,452 | B2 | * | 12/2013 | Lee et al. | 324/765.01 |
| 2001/0041412 | A1 | | 11/2001 | Takasu | |
| 2002/0033504 | A1 | | 3/2002 | Ohnakado | |
| 2006/0227126 | A1 | | 10/2006 | Kawagoshi | |
| 2008/0185678 | A1 | | 8/2008 | Kitajima | |

FOREIGN PATENT DOCUMENTS

| JP | 2944573 B2 | 6/1999 |
| JP | 2000-133778 A | 5/2000 |
| JP | 2001-320019 A | 11/2001 |
| JP | 2002-100761 A | 4/2002 |
| JP | 2003-110029 A | 4/2003 |
| JP | 2006-294903 A | 10/2006 |
| JP | 2008-192986 A | 8/2008 |
| JP | 2013-007619 A | 1/2013 |

* cited by examiner

*Primary Examiner* — Quan Tra
(74) *Attorney, Agent, or Firm* — Rossi, Kimms & McDowell LLP

(57) ABSTRACT

A low cost, small scale semiconductor device including a trimming circuit having a fuse resistor is disclosed. By a trimming circuit being configured of a MOSFET, a protection circuit, and a fuse resistor, it is possible to carry out a change from an open circuit state to a short circuit state by fusing the fuse resistor. Also, by the protection circuit and fuse resistor configuring the trimming circuit being formed in a two layer structure, it is possible to reduce the size of the trimming circuit, and thus it is possible to provide a low cost, small scale semiconductor device having a trimming circuit that occupies a small area.

9 Claims, 12 Drawing Sheets

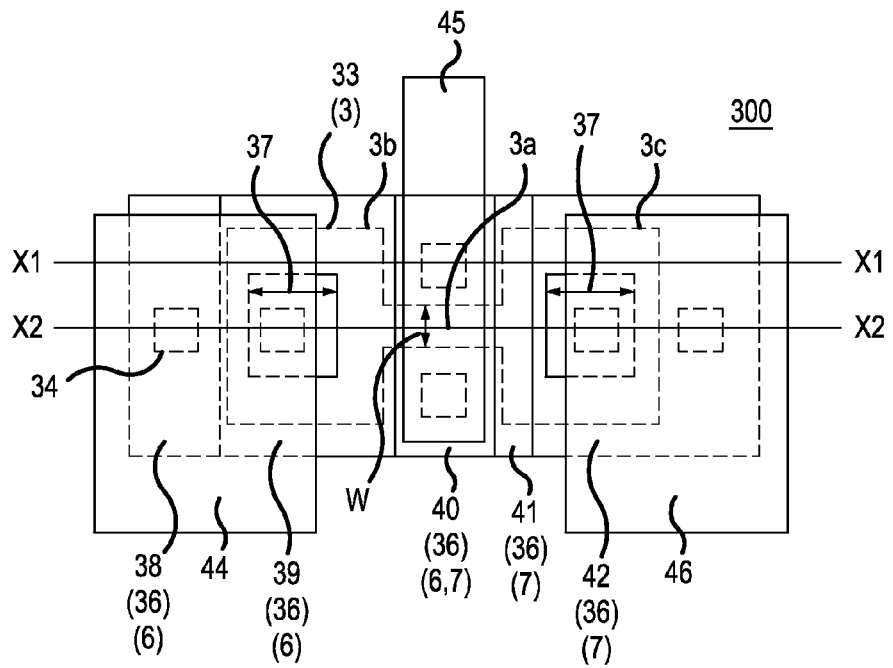
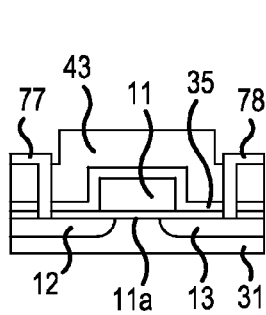
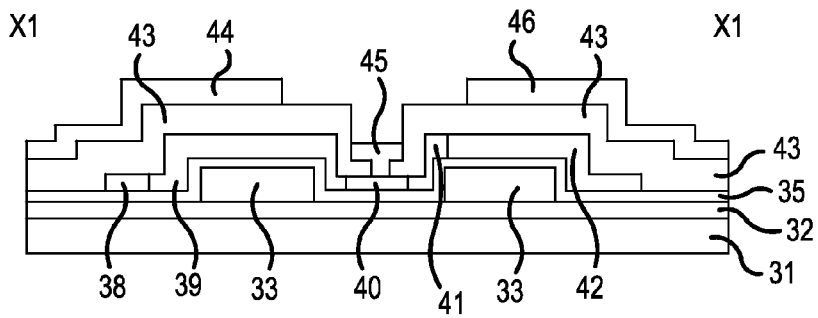
FIG.5(d)   FIG.5(b)
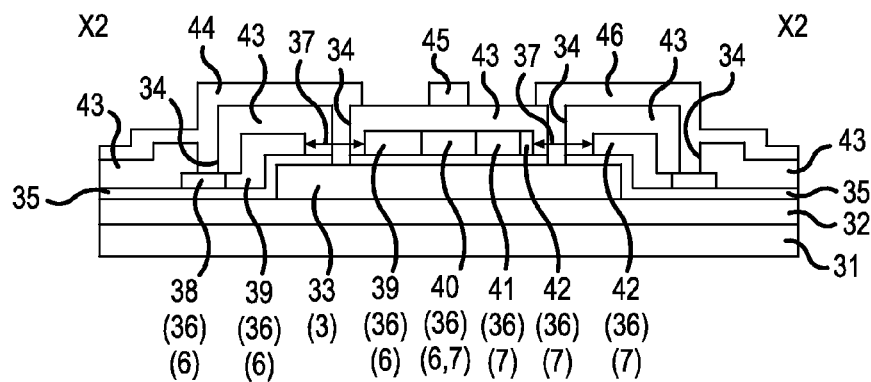
FIG.5(c)

SEMICONDUCTOR DEVICE

BACKGROUND OF THE INVENTION

A. Field of the Invention

The present invention relates to a semiconductor device having a trimming circuit.

B. Description of the Related Art

In a semiconductor integrated circuit, adjustment is carried out using a method known as trimming in order to correct fluctuation in circuit characteristics caused by manufacturing variation. A fuse resistor, Zener zap diode, or the like, is used as a trimming element.

A fuse resistor is normally a polysilicon resistor formed of a polysilicon film, wherein a short circuit state between terminals of the fuse resistor is changed to an open circuit state by the polysilicon resistor being fused. As methods of fusing the fuse resistor, there is a method using a laser, and a method whereby current is caused to flow and the Joule heat of the current utilized. The method whereby current is caused to flow is widely used, as it can be comparatively simply implemented utilizing an external voltage source or a voltage source incorporated in an integrated circuit.

A Zener zap diode causes short circuit breakdown with an avalanche current in a p-n junction by applying a voltage, thus causing a change from an open circuit state to a short circuit state between a cathode terminal and an anode terminal.

A trimming circuit is configured of the trimming element alone, or of a circuit including the trimming element, and the circuit characteristics of a semiconductor integrated circuit are corrected by bringing about a short circuit state or open circuit state between a first terminal and second terminal, which are output terminals of the trimming circuit, thereby changing the circuit constants.

FIGS. 12(a) and 12(b) are circuit diagrams showing cases in which series resistor circuit 50 is adjusted using trimming circuits 51 and 52, wherein FIG. 12(a) is a diagram of a case in which fuse resistor 53 is used as trimming circuit 51, and FIG. 12(b) is a diagram of a case in which Zener zap diode 54 is used as trimming circuit 52.

In FIG. 12(a), one end of series resistor circuit 50, which is configured of five resistors R1 to R5, is connected to power supply terminal 61, the other end is connected to a ground GND, and a reference voltage VREF is output from reference voltage terminal 62 connected to a connection point of the uppermost stage resistor R1 and second stage resistor R2. First terminal 53a and second terminal 53b of fuse resistor 53 are connected with two ends of the lowermost stage resistor R5, respectively. The design is such that when a power supply voltage VDD0 is applied to power supply terminal 61, the reference voltage VREF=V1 is output. When the manufacturing process is finished, VDD0 is applied to power supply terminal 61, the reference voltage VREF is measured, and a voltage lower than V1 is indicated due to manufacturing variation, fuse resistor 53 of trimming circuit 51 is fused. By fuse resistor 53 being fused, there is a change to an open circuit state between first terminal 53a and second terminal 53b, and the reference voltage VREF increases. By VREF increasing, VREF nears V1, which is the set voltage, and is thus adjusted.

In FIG. 12(b), one end of series resistor circuit 50 configured of the five resistors R1 to R5 is connected to power supply terminal 61, the other end is connected to the ground GND, and the reference voltage VREF is output from the reference voltage terminal 62 connected to the connection point of the uppermost stage resistor R1 and second stage resistor R2. First terminal 54a and second terminal 54b of Zener zap diode 54 of trimming circuit 52 are connected with two ends of the lowermost stage resistor R5, respectively. The design is such that when the power supply voltage VDD0 is applied to power supply terminal 61, the reference voltage VERF=V1 is output. When the manufacturing process is finished, VDD0 is applied to power supply terminal 61, the reference voltage VREF is measured, and a voltage higher than V1 is indicated due to manufacturing variation, Zener zap diode 54 of trimming circuit 52 is short circuited. By Zener zap diode 54 being short circuited, there is a change to a short circuit state between first terminal 54a and second terminal 54b, and the reference voltage VREF decreases. By VREF decreasing, VREF nears V1, which is the set voltage, and is thus adjusted.

Trimming is also possible in the same way when using a series MOSFET circuit, wherein MOSFETs are connected in series, instead of series resistor circuit 50. In this case, it is good when the first terminal and second terminal of the trimming circuit are connected to the drain and source of a MOSFET.

In JP-A-2003-110029, a description is given of a semiconductor device and trimming method thereof such that an increase in IC chip area and external terminals is suppressed, and no retrimming is carried out after the final trimming adjustment is finished.

In Japanese Patent No. 2,944,573, a description is given of a semiconductor integrated circuit such that it is possible before trimming to confirm the operating state after trimming, without providing a dedicated circuit or an extra data input pad for confirming trimming in advance.

Examples of a trimming circuit using a polysilicon fuse are shown in JP-A-2003-110029 and Japanese Patent No. 2,944,573.

In JP-A-2008-192986, a description is given of fuse elements being deposited in an upper portion of a resistor. Furthermore, a description is given of a semiconductor device and manufacturing method thereof such that, by a depressed form being adopted for a resistor below a region of the fuse element cut off by laser, the resistor is of a small area and suffers little damage when cutting off the fuse element, contact resistance and the like occurring between elements is low, and stability is provided.

In JP-A-2002-100761, a polysilicon lateral diode is formed and connected between a high frequency input/output signal line and an external supply power supply VDD, and between an external ground voltage GND and the high frequency input/output signal line, so that each of an orientation from the high frequency input/output signal line to the external supply power supply VDD and an orientation from the external ground voltage GND to the high frequency input/output signal line is the diode forward direction. It is described that, because of this, it is possible to provide a highly reliable, sophisticated high frequency Si-MOS semiconductor device having high ESD resistance.

In JP-A-2001-320019, a configuration includes a p-type thin film resistor formed of a p-type semiconductor thin film and an n-type thin film resistor formed of an n-type semiconductor thin film, wherein a change in the resistance value when stress is exerted is compensated for. A manufacturing method whereby this is obtained is such that a low resistance region is formed simultaneously inside an n-type polycrystalline silicon resistor in the step of forming the source and drain of an NMOS transistor. It is described that by a low resistance region being formed simultaneously inside a p-type polycrystalline silicon resistor in the step of forming the source and drain of a PMOS transistor region, it is possible to provide a semiconductor device having a bleeder resistor circuit wherein the resistance value does not fluctuate in response to stress.

In JP-A-2000-133778, it is described that a trimming circuit using a fuse of an LCD controller IC having a plurality of gate oxide films is such that, by using an oxide film other than the thinnest oxide film for the gate oxide film of an input circuit transistor, and using an oxide film other than the thinnest of the plurality of oxide films for the input circuit transistor, breakdown of the input circuit gate oxide film when fuse trimming is prevented, and characteristics are not caused to deteriorate even by an application of voltage when fuse trimming.

In JP-A-2006-294903, a description is given of a method of preventing a fuse resistor being cut off by an application of static electricity to a trimming pad.

In JP-A-2013-7619, it is described that, by adopting a logic circuit and voltage detector circuit including a first fuse connected between a power supply terminal and output terminal and a second fuse connected between a ground terminal and output terminal, and including a logic selection circuit such that either the first fuse or second fuse is necessarily cut off when selecting output logic, current consumption is suppressed regardless of whether a high level or low level output logic is selected.

The present invention is directed to overcoming or at least reducing the effects of one or more of the problems set forth above.

SUMMARY OF THE INVENTION

With only fuse resistor 53 shown in FIG. 12A, it is possible only to change a short circuit state between terminals 53a and 53b to an open circuit state, and not possible to change from an open circuit state to a short circuit state.

Because of this, in the case of a semiconductor integrated circuit wherein it is necessary to carry out the two kinds of state change in the trimming circuit, both trimming circuit 51 configured of fuse resistor 53 that can be changed from a short circuit state to an open circuit state and trimming circuit 52 configured of Zener zap diode 54 that can be changed from an open circuit state to a short circuit state are necessary.

However, when using both the trimming circuits, a voltage supply for causing current to flow through and fuse resistor 53 and a voltage supply for breaking the p-n junction of Zener zap diode 54 are necessary. Realizing the two kinds of voltage supply with voltage supplies inside an integrated circuit leads to an increase in cost due to an increase in circuit scale, while realizing the two kinds of voltage supply with external voltage supplies leads to an increase in cost due to an increase in trimming equipment.

As a high voltage is applied to an unshown trimming pad when fusing fuse resistor 53 or when short circuiting Zener zap diode 54, there is a need for a method of protecting each kind of circuit to which the trimming circuits 51 and 52 are connected from the high voltage.

As it is difficult for Zener zap diode 54 to be formed simultaneously with other elements (for example, a MOS-FET) configuring a semiconductor device such as a semiconductor integrated circuit, the manufacturing process is complex, and the manufacturing cost increases.

The present invention resolves the heretofore described problems by providing a low cost, small scale semiconductor device having a trimming circuit, wherein it is possible to change from an open circuit state to a short circuit state using a fuse resistor.

A semiconductor device according to a first aspect of the invention includes a trimming circuit including a constant current circuit, a fuse resistor of which one end is connected to the constant current circuit, a trimming pad connected to a connection point connecting the constant current circuit and the one end of the fuse resistor, a protection resistor of which one end is connected to the connection point, a protection diode of which a cathode is connected to the other end of the protection resistor, a MOS transistor of which a gate is connected to the other end of the protection resistor, and a ground to which are connected the other end of the fuse resistor and an anode of the protection diode, wherein the fuse resistor, protection resistor, and protection diode are formed of a polysilicon layer disposed across a first dielectric on a semiconductor substrate.

According to a second aspect of the invention, it is preferred when the semiconductor device according to the first aspect of the invention is such that a first layer polysilicon layer in which the fuse resistor is formed is disposed on the first dielectric, a second layer polysilicon layer in which the protection resistor and protection diode are formed is disposed across a second dielectric on the first layer polysilicon layer, and a third dielectric is disposed on the second layer polysilicon layer.

According to a third aspect of the invention, it is preferred when the semiconductor device according to the second aspect of the invention is such that the fuse resistor is selectively formed in the first layer polysilicon layer.

According to a fourth aspect of the invention, it is preferred when the semiconductor device according to the second or third aspect of the invention is such that an end portion of the protection resistor includes a common region that doubles as a cathode region of the protection diode.

According to a fifth aspect of the invention, it is preferred when the semiconductor device according to the second to fourth aspects of the invention includes a first aperture portion, formed in the protection resistor, through which passes a first metal wiring for connecting the fuse resistor and protection resistor, and a second aperture portion, formed in the anode region of the protection diode, through which passes a second metal wiring for connecting the fuse resistor and protection diode.

According to a sixth aspect of the invention, it is preferred when the semiconductor device according to the fifth aspect of the invention is such that the third dielectric is disposed in the first aperture portion and second aperture portion, the first metal wiring is disposed on a contact portion formed in the third dielectric and second dielectric in the interior of the first aperture portion, and the second metal wiring is disposed on a contact portion formed in the third dielectric and second dielectric in the interior of the second aperture portion.

According to a seventh aspect of the invention, it is preferred when the semiconductor device according to any one of the second to sixth aspects of the invention is such that the fuse resistor includes a fusion portion and first and second contact regions, disposed on either side of the fusion portion, with a width greater than the width of the fusion portion, the common region is formed on the second dielectric from a portion above the fusion portion to a region between the first contact region and second contact region in which the fusion portion is not formed, and includes a third metal wiring that connects the gate of the MOS transistor and the common region, and the common region and third metal wiring are connected in the region between the first contact region and second contact region in which the fusion portion is not formed.

According to an eighth aspect of the invention, it is preferred when the semiconductor device according to the first aspect of the invention is such that a first layer polysilicon layer in which the protection resistor and protection diode are formed is disposed on the first dielectric, and a second layer polysilicon layer in which the fuse resistor is formed is disposed across a second dielectric on the first layer polysilicon layer.

According to a ninth aspect of the invention, it is preferred when the semiconductor device according to the third aspect of the invention is such that the size of the polysilicon layer on the lower side is equal to or greater than the size of the polysilicon layer on the upper side.

The invention is such that is it possible to provide a low cost, small scale semiconductor device by a trimming circuit being configured of a MOSFET, a protection circuit, and a fuse resistor, and the protection circuit and fuse resistor configuring the trimming circuit being formed in a two layer structure.

BRIEF DESCRIPTION OF THE DRAWINGS

The foregoing advantages and features of the invention will become apparent upon reference to the following detailed description and the accompanying drawings, of which:

FIGS. 2(a) and 2(b) are diagrams illustrating conditions before and after trimming in the trimming circuit of FIG. 1, wherein FIG. 2(a) is a diagram of the condition before trimming and FIG. 2(b) is a diagram of the condition after trimming;

FIGS. 5(a) to 5(d) are main portion configuration diagrams of a semiconductor device according to a third example of the invention, wherein FIG. 5(a) is a plan view, FIG. 5(b) is a sectional view cut along an X1-X1 line of FIG. 5(a), FIG. 5(c) is a sectional view cut along an X2-X2 line of FIG. 5(a), and FIG. 5(d) is a sectional view of the MOSFET;

FIGS. 6(a) to 6(c) are plan views wherein the layers of FIGS. 5(a) to 5(d) are disassembled, wherein FIG. 6(a) is a diagram of a fuse resistor formed of a lower layer polysilicon, FIG. 6(b) is a diagram of a protection diode and protection resistor formed of an upper layer polysilicon, and FIG. 6(c) is a diagram of metal wirings on an uppermost layer;

FIGS. 7(a) and 7(b) are schematic illustrations of the protection diode, protection resistor, and fuse resistor of FIGS. 5(a) to 5(d), wherein FIG. 7(a) is a sectional view and FIG. 7(b) is a circuit diagram;

FIGS. 8(a) to 8(d) are main portion configuration diagrams of a semiconductor device according to a fourth example of the invention, wherein FIG. 8(a) is a plan view of the fuse resistor, FIG. 8(b) is a plan view of the protection diode and protection resistor, FIG. 8(c) is a sectional view cut along an X1-X1 line of FIGS. 8(a) and 8(b), and FIG. 8(d) is a sectional view cut along an X2-X2 line of FIGS. 8(a) and 8(b);

FIGS. 9(a) to 9(d) are main portion configuration diagrams of a semiconductor device according to a fifth example of the invention, wherein FIG. 9(a) is a plan view of the protection diode and protection resistor, FIG. 9(b) is a plan view of the fuse resistor, FIG. 9(c) is a sectional view cut along an X1-X1 line of FIGS. 9(a) and 9(b), and FIG. 9(d) is a sectional view cut along an X2-X2 line of FIGS. 9(a) and 9(b);

FIGS. 10(a) to 10(d) are main portion configuration diagrams of a semiconductor device according to a sixth example of the invention, wherein FIG. 10(a) is a plan view of the protection diode and protection resistor, FIG. 10(b) is a plan view of the fuse resistor, FIG. 10(c) is a sectional view cut along an X1-X1 line of FIGS. 10(a) and 10(b), and FIG. 10(d) is a sectional view cut along an X2-X2 line of FIGS. 10(a) and 10(b);

FIGS. 12(a) and 12(b) are circuit diagrams showing cases in which a series resistor circuit is adjusted using trimming circuits, wherein FIG. 12(a) is a diagram of a case in which a fuse resistor is used as the trimming circuit, and FIG. 12(b) is a diagram of a case in which a Zener zap diode is used as the trimming circuit.

DETAILED DESCRIPTION OF SPECIFIC EMBODIMENTS

An embodiment of the invention will be described with the following examples.

Example 1

Figure 1:
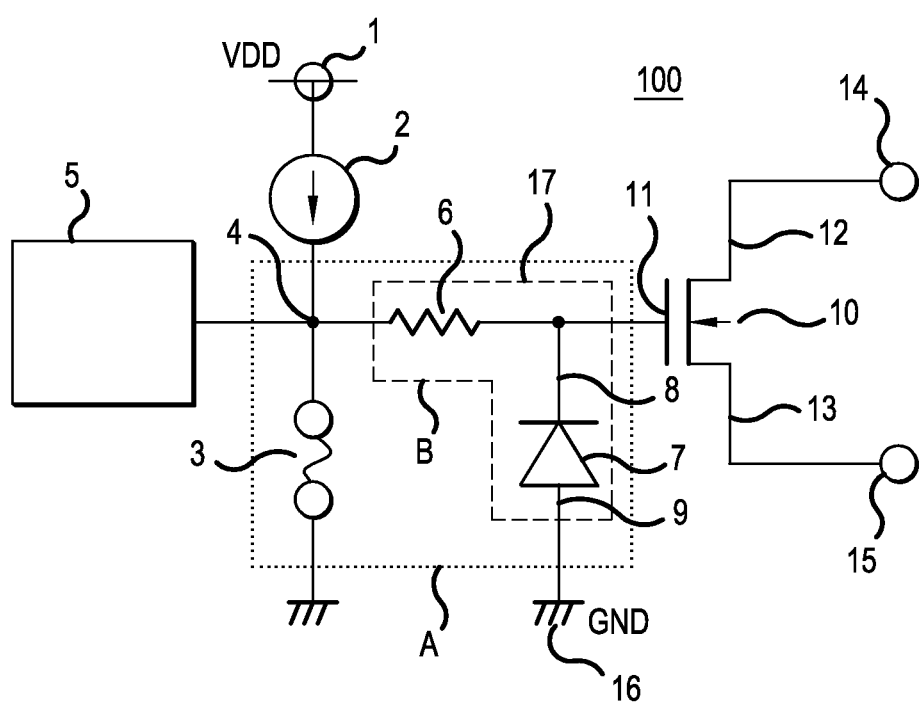
FIG. 1 is a main portion circuit diagram of a trimming circuit according to a first example of the invention.

FIG. 1 is a main portion circuit diagram of a trimming circuit 100 according to a first example of the invention.

Trimming circuit 100 of FIG. 1 includes constant current circuit 2 connected to power supply 1, and fuse resistor 3 of which one end is connected to constant current circuit 2. Trimming circuit 100 includes trimming pad 5 connected to connection point 4 (node) that connects constant current circuit 2 and one end of fuse resistor 3. Also, trimming circuit 100 includes protection resistor 6 of which one end is connected to connection point 4, protection diode 7 of which cathode 8 is connected to the other end of protection resistor 6, and n-channel type MOSFET 10 of which gate 11 is connected to the other end of protection resistor 6. Trimming circuit 100 includes first terminal 14 connected to drain 12 of MOSFET 10, and second terminal 15 connected to source 13. The other end of fuse resistor 3 and anode 9 of protection diode 7 are connected to ground 16. Fuse resistor 3 is a polysilicon resistor formed of a polysilicon film. A portion B is protection circuit 17 formed of protection resistor 6 and protection diode 7.

Trimming circuit 100 is of a type such that a high voltage is applied to trimming pad 5 from an external voltage supply (or an internal voltage supply, for example, the power supply 1), current is caused by the voltage to flow through fuse resistor 3, and fuse resistor 3 is fused by the Joule heat of the current.

Figure 2A:
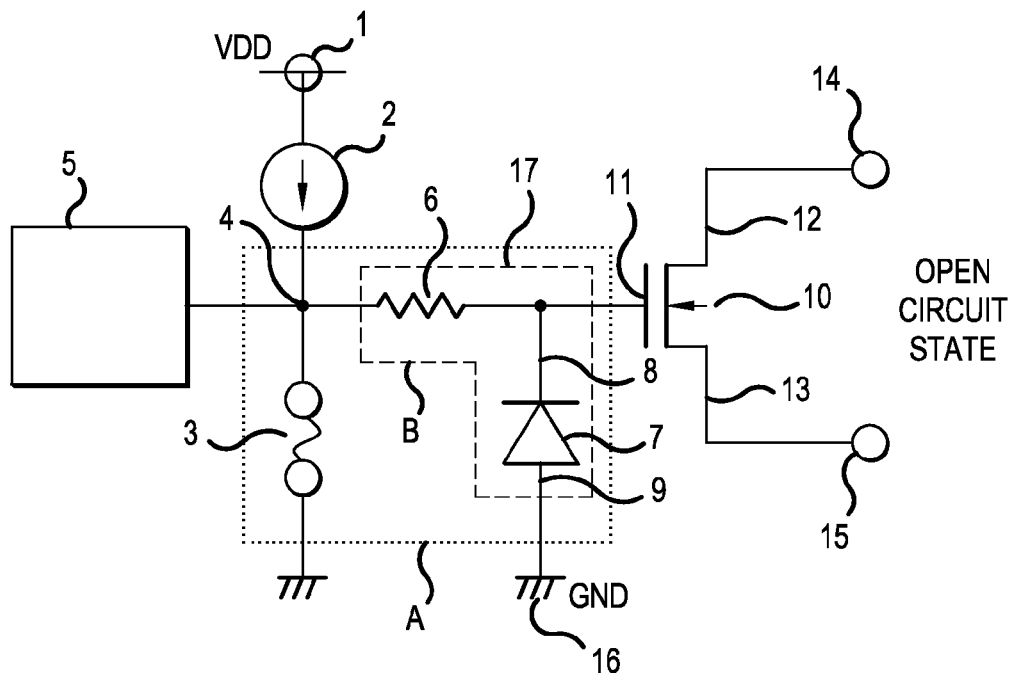
Figure 2B:
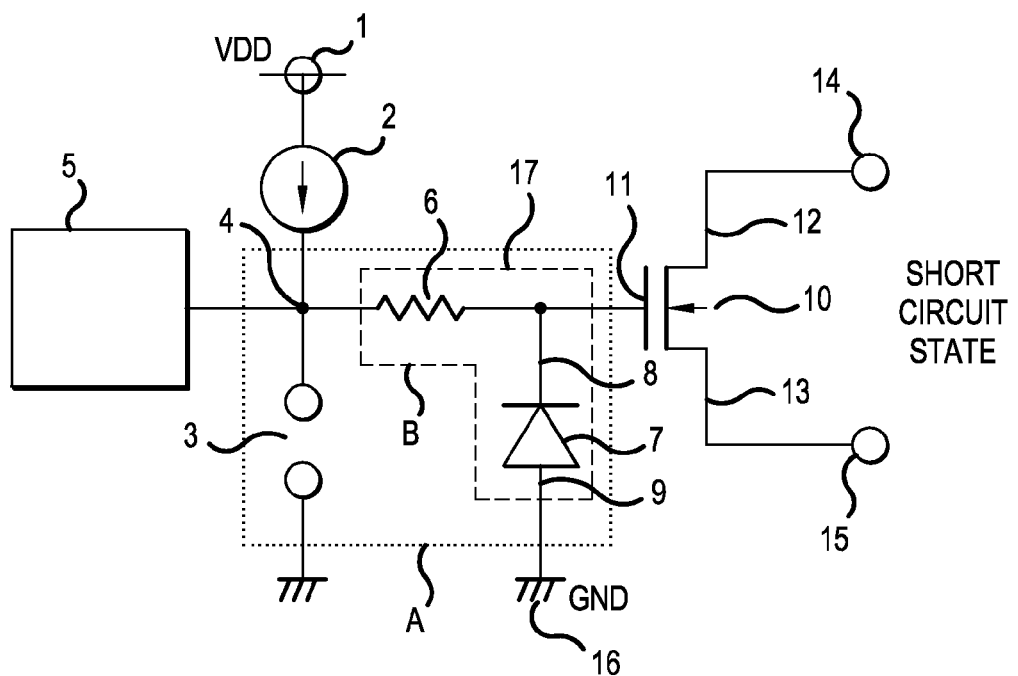

FIGS. 2(a) and 2(b) are diagrams illustrating conditions before and after trimming in trimming circuit 100 of FIG. 1, wherein FIG. 2(a) is a diagram of the condition before trimming and FIG. 2(b) is a diagram of the condition after trimming.

Before trimming, gate 11 of MOSFET 10 is pulled down to the ground 16 by fuse resistor 3, as shown in FIG. 2(a). As the current value of the constant current supply is set sufficiently low, the voltage generated across the fuse resistor is low, and MOSFET 10 is in an off-state. Because of this, there is an open circuit state between first terminal 14 and second terminal 15.

When implementing trimming, an open circuit state is obtained by a high voltage being applied to trimming pad 5 and current being caused to flow through fuse resistor 3, thereby fusing fuse resistor 3, as shown in FIG. 2(b). Consequently, after trimming, fuse resistor 3 has been fused and is in an open circuit state, because of which gate 11 of MOSFET 10 is raised to a VDD potential by constant current circuit 2. Owing to this raising, MOSFET 10 changes to an on-state, and there is a short circuit state between first terminal 14 and second terminal 15.

The high voltage applied to trimming pad 5 is applied via protection circuit 17 to gate 11 of MOSFET 10 as a low voltage, because of which there is no dielectric breakdown of a gate dielectric of MOSFET 10.

Figure 3:
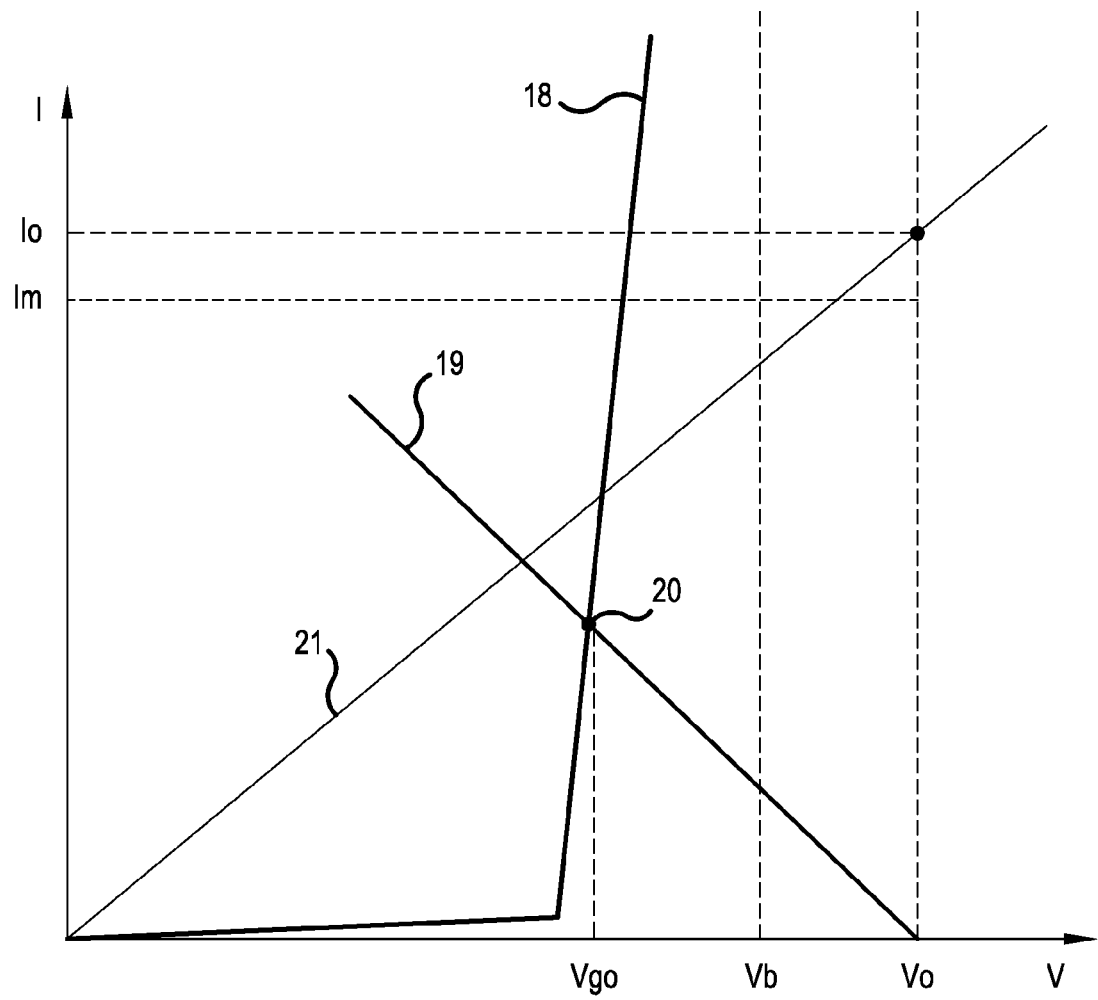
FIG. 3 is a diagram illustrating an operation of a protection circuit of FIG. 1.

FIG. 3 is a diagram illustrating an operation of protection circuit 17 of FIG. 1. A voltage Vgo applied to gate 11 of MOSFET 10 when a voltage (Vo) is applied to trimming pad 5 is determined from intersection 20 of I-V curve 18 of protection diode 7 and I-V line 19 (load line) of protection resistor 6. Also, a current lo flowing through fuse resistor 3 is determined from I-V line 21 of fuse resistor 3.

In FIG. 3, the current lo flowing through fuse resistor 3 is equal to or greater than a fuse fusing current lm, and the voltage Vgo applied to gate 11 of MOSFET 10 is equal to or lower than a breakdown voltage Vb of a gate oxide film of MOSFET 10. That is, owing to the effect of protection diode 7 and protection resistor 6, fusion of fuse resistor 3 and protection of the gate oxide film of MOSFET 10 are realized simultaneously.

In order to appropriately protect the gate oxide film, it is necessary that protection resistor 6 is of high resistance and protection diode 7 of low operating resistance so as to satisfy the relationship shown in FIG. 3.

Example 2

Figure 4:
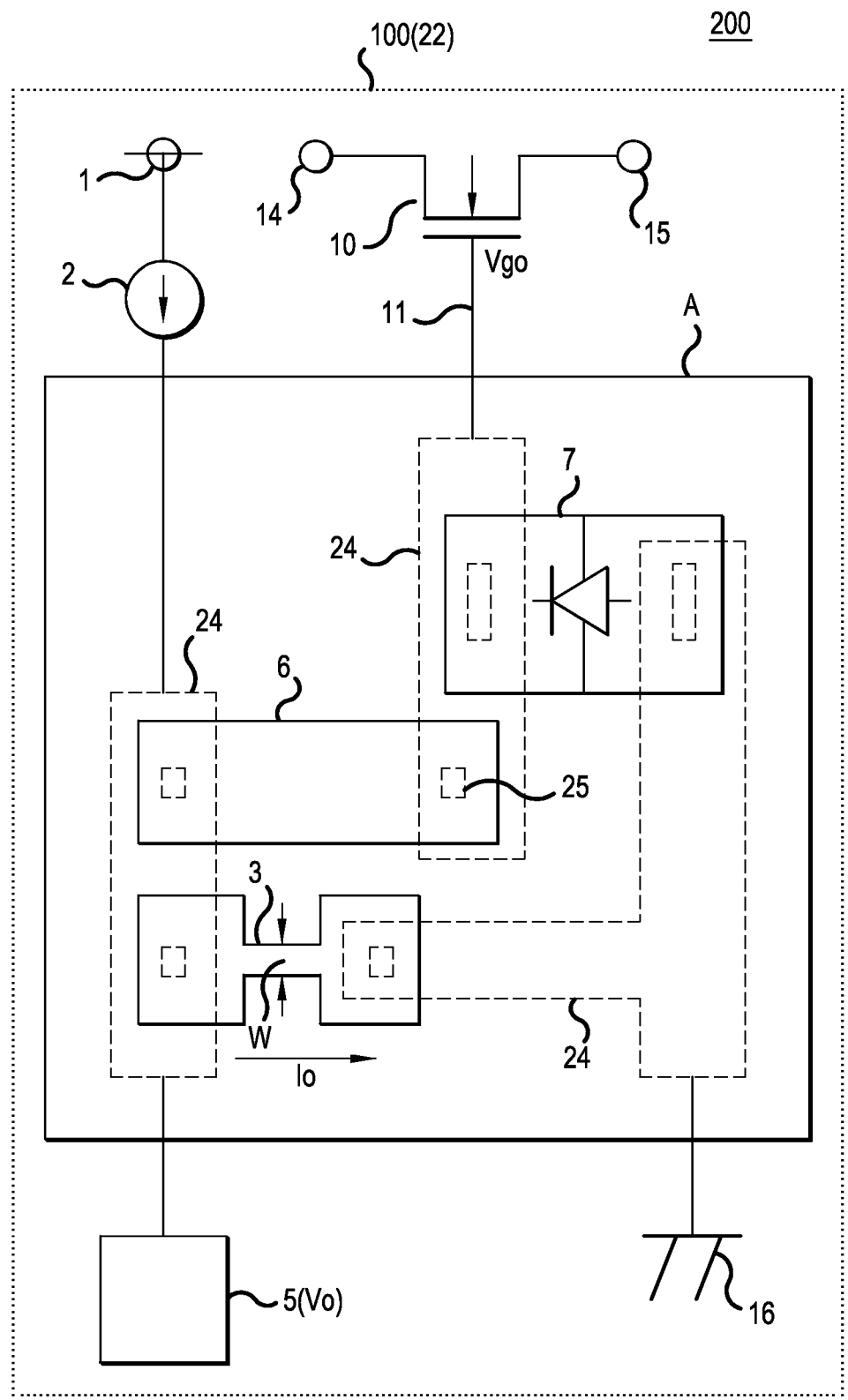
FIG. 4 is a configuration diagram of a semiconductor device according to a second example of the invention.

FIG. 4 is a configuration diagram of semiconductor device 200 according to a second example of the invention. The diagram shows a main portion plan view of a portion A of trimming circuit 100 and a circuit configuration diagram.

Semiconductor device 200 includes an unshown dielectric, such as a LOCOS oxide film, disposed on semiconductor substrate 22, and protection diode 7, protection resistor 6, and fuse resistor 3 on the dielectric. Furthermore, semiconductor device 200 includes constant current circuit 2 connected to the power supply 1, trimming pad 5, first terminal 14, and the second terminal 15.

Each of fuse resistor 3, protection resistor 6, and protection diode 7 is connected via contact portion 25 shown by dotted lines to metal wiring 24 shown by dotted lines. Herein, only the layout of the portion A of trimming circuit 100 configuring semiconductor device 200 is shown, while other portions are shown as circuits.

Protection diode 7 and protection resistor 6, and fuse resistor 3, are formed of one polysilicon layer. A width W of a central portion of fuse resistor 3 is small so as to be easily fused. Constant current circuit 2 is configured of, for example, a depletion MOSFET. Power supply 1 is an internal power supply formed inside semiconductor device 200.

Fuse resistor 3 is fused by the voltage V0 being applied to trimming pad 5 and the current lo being caused to flow through fuse resistor 3. By fuse resistor 3 being fused, there is a change from an open circuit state to a short circuit state between first terminal 14 and second terminal 15 of MOSFET 10. Owing to the change in state, a resistor or MOSFET configuring an unshown semiconductor integrated circuit connected to first terminal 14 and second terminal 15 is trimmed (adjusted).

As the high voltage V0 applied due to the fusion of fuse resistor 3 is suppressed by protection resistor 6 and protection diode 7 configuring protection circuit 17, the low voltage Vgo is applied to gate 11 of MOSFET 10, whereby gate 11 is protected from the high voltage V0.

Next, a description will be given of an example where the area occupied by the portion A of trimming circuit 100 is reduced.

Example 3

FIGS. 5(a) to 5(d) are main portion configuration diagrams of semiconductor device 300 according to a third example of the invention, wherein FIG. 5(a) is a plan view, FIG. 5(b) is a sectional view cut along an X1-X1 line of FIG. 5A, FIG. 5(c) is a sectional view cut along an X2-X2 line of FIG. 5(a), and FIG. 5(d) is a sectional view of MOSFET 10. The drawings are a plan view and sectional views of the portion A of trimming circuit 100, and a sectional view of MOSFET 10, formed on the same semiconductor substrate 31, formed in a region different from that of the portion A.

Figure 6A:
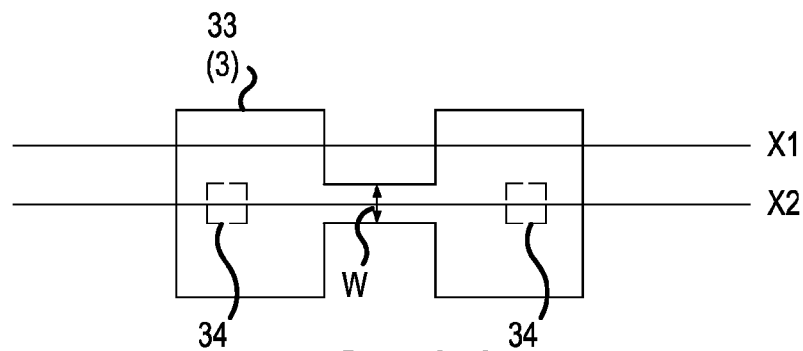
Figure 6B:
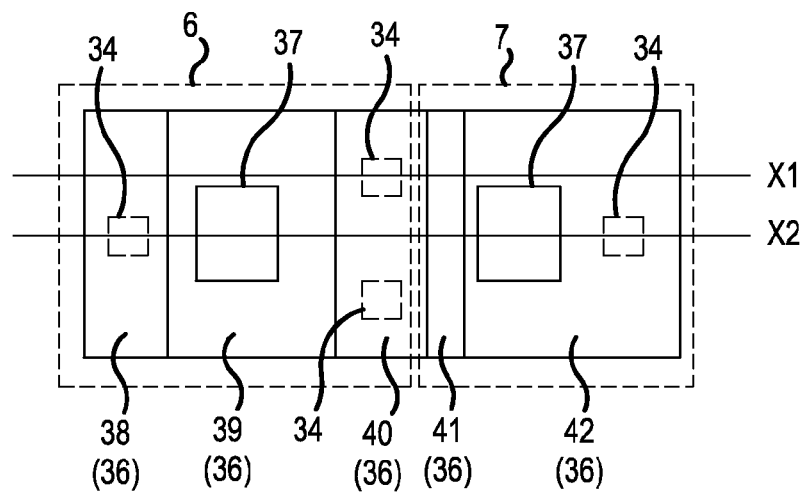
Figure 6C:
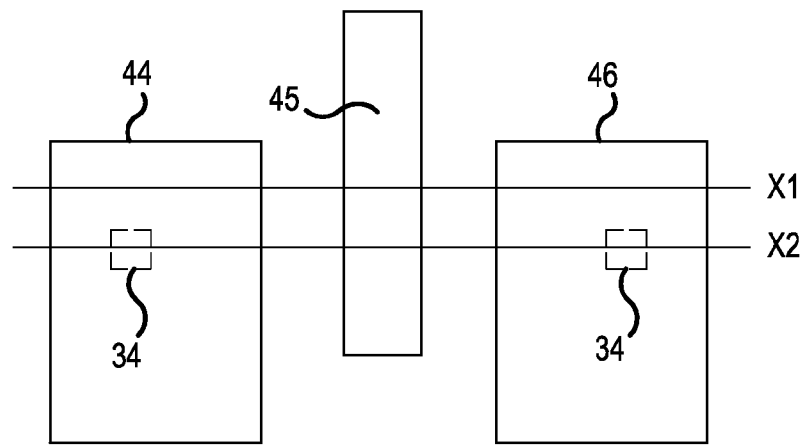

FIGS. 6(a) to 6(c) are plan views wherein the layers of FIG. 5(a) are disassembled, wherein FIG. 6(a) is a diagram of fuse resistor 3 formed of polysilicon layer 33, FIG. 6(b) is a diagram of protection diode 7 and protection resistor 6 formed of polysilicon layer 36, and FIG. 6(c) is a diagram of metal wirings 44, 45, and 46 on an uppermost layer.

Figure 7A:
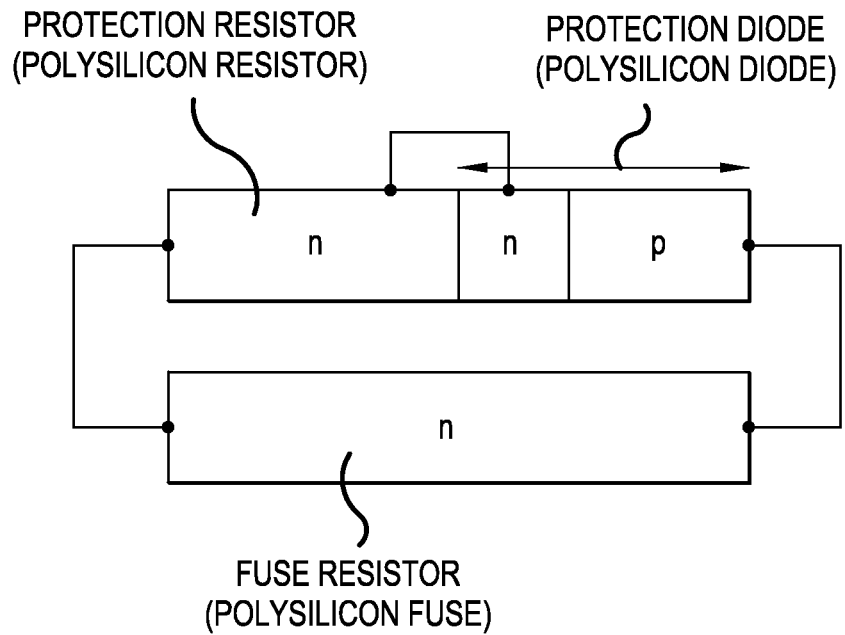
Figure 7B:
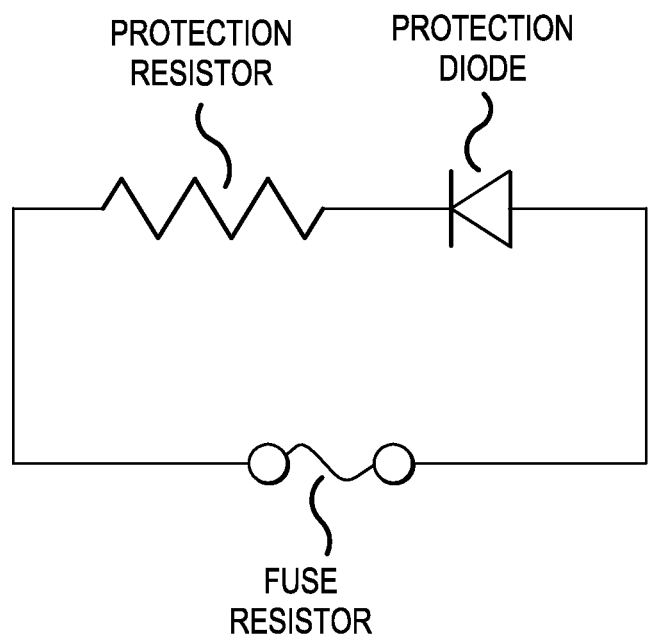

FIGS. 7(a) and 7(b) are schematic illustrations of protection diode 7, protection resistor 6, and fuse resistor 3 of FIGS. 5(a) to 5(d), wherein FIG. 7(a) is a sectional view and FIG. 7(b) is a circuit diagram.

A description will be given, using FIGS. 5(a) to 7(b), of a main portion configuration of trimming circuit 100 formed in the semiconductor device 300 shown in FIGS. 5(a) to 5(d).

Fuse resistor 3 (polysilicon fuse) formed of polysilicon layer 33 is disposed on dielectric (LOCOS oxide film) 32 formed on semiconductor substrate 31. Fuse resistor 3 is configured of fusion portion 3a, of which the width W is small so as to be easily fused, and contact regions 3b and 3c formed with a width greater than the width W of the fusion portion at either end of fusion portion 3a. Each of contact regions 3b and 3c of fuse resistor 3 is connected via contact portion 34 to upper portion metal wirings 44 to 46. Polysilicon layer 33 is a doped polysilicon doped with high concentration phosphorus when deposited, and is designed so as to have a comparatively low resistance value without the area of fuse resistor 3 (the width of the current path) being increased. As gate 11 of MOSFET 10 shown in FIG. 5(d) is also fabricated of a doped polysilicon with a comparatively low resistance value, polysilicon layer 33 and gate 11 can be formed simultaneously. Specifically, it is sufficient that polysilicon layer 33 is formed after gate oxide film 11a and dielectric 32 formed of a LOCOS oxide film, or the like, thicker than gate oxide film 11a are formed on semiconductor substrate 31.

Dielectric 35 is formed on polysilicon layer 33, and furthermore, polysilicon layer 36 is disposed on dielectric 35. In the example shown in the drawings, a high temperature oxide (HTO) is used as dielectric 35 between polysilicon layer 33 and polysilicon layer 36. Polysilicon layer 36 is disposed so as to cover the whole of fuse resistor 3 formed of polysilicon layer 33. However, an aperture portion 37 through which dielectric 35 is exposed is formed in polysilicon layer 36. A first n-F type diffusion region 38, first n− type diffusion region 39, second n+ type diffusion region 40, second n− type diffusion region 41, and p+ type diffusion region 42 formed in polysilicon layer 36 are formed by ion implantation. The first and second n+ type diffusion regions 38 and 40 form the two terminals of protection resistor 6, configuring protection resistor 6 including first n− type diffusion region 39 sandwiched by the two terminals. By reducing the impurity concentration of first n− type diffusion region 39, thus increasing the sheet resistance value, protection resistor 6 is realized with a high resistance and small size.

Second n+ type diffusion region 40, second n− type diffusion region 41, and p+ type diffusion region 42 configure protection diode 7 (polysilicon diode), which has p+ type diffusion region 42 as anode 9 and second n+ type diffusion region 40 as cathode 8. By second n− type diffusion region 41 being formed between second n+ type diffusion region 40 and p+ type diffusion region 42, it is possible to provide a higher breakdown voltage than when forming a diode with an n+ type diffusion region and p+ type diffusion region, and freedom of design increases. Herein, the concentration of second n− type diffusion region 41 is set to an appropriate concentration such that not too great a current flows when there is breakdown, and the breakdown voltage does not exceed the withstand voltage of the gate oxide film. The concentration is in the region of, for example, $1 \times 10^{16} cm^{-3}$ to $1 \times 10^{18} cm^{-3}$.

In the example shown in the drawings, the terminal on one side of protection resistor 6 (polysilicon resistor) and cathode 8 of protection diode 7 are a common region commonalized as second n+ type diffusion region 40, and each diffusion region is formed in polysilicon layer 36, in order to reduce the area occupied by the portion A.

Interlayer dielectric 43 is formed on polysilicon layer 36, and furthermore, metal wirings 44 to 46 are formed on interlayer dielectric 43. In the example shown in the drawings, borophosphosilicate glass (BPSG) is used as interlayer dielectric 43. First metal wiring 44 is disposed on one of contact portions 34 formed in interlayer dielectric 43 and dielectric 35, and thus connected to one terminal of fuse resistor 3 of polysilicon layer 33, as shown in FIG. 5C. Contact portion 34 is formed in the interior of aperture portion 37 formed in first n− type diffusion region 39, which is one terminal of protection resistor 6.

Furthermore, first metal wiring 44 is disposed on another contact portion 34 formed in interlayer dielectric 43, and thus connected to first n+ type diffusion region 38, which is one terminal of protection resistor 6 of polysilicon layer 36. Although not shown in FIGS. 5(a) to 5(d), first metal wiring 44 is connected to trimming pad 5 of trimming circuit 100 shown in FIG. 1. Second metal wiring 45 is disposed on one of contact portions 34 formed in interlayer dielectric 43, and thus connected to second n+ type diffusion region 40 of polysilicon layer 36, as shown in FIG. 5(b).

That is, second metal wiring 45 is connected to second n+ type diffusion region 40, wherein the other terminal of protection resistor 6 and cathode 8 of protection diode 7 are commonalized. Contact portion 34 for connecting second metal wiring 45 and second n+ type diffusion region 40 is disposed avoiding the region above fusion portion 3a of fuse resistor 3. Forming contact portion 34 in the region above fusion portion 3a is not desirable, as heat generated in the fusion portion is liable to be released to the wiring via the contact portion, and it is thus difficult for the fuse to fuse. Also, depending on the width of the contact portion and the width of the fusion portion, the contact portion may be formed in an uneven place, which is not desirable with regard to workability. Second metal wiring 45 is electrically connected to gate 11 shown in FIG. 5(d). Third metal wiring 46 is disposed on one of contact portions 34 formed in interlayer dielectric 43 and dielectric 35, and thus connected to the other terminal of fuse resistor 3 of polysilicon layer 33, as shown in FIG. 5(c). Contact portion 34 is formed in the interior of aperture portion 37 formed in p+ type diffusion region 42, which is anode 9 of the protection diode. Furthermore, third metal wiring 46 is disposed on another contact portion 34 formed in interlayer dielectric 43, and thus connected to p+ type diffusion region 42, which is anode 9 of protection diode 7 of polysilicon layer 36.

Although not shown in FIGS. 5(a) to 5(d), third metal wiring 46 is connected to ground 16 (GND) of trimming circuit 100 shown in FIG. 1.

MOSFET 10 of FIG. 5(d) includes drain 12 and source 13 formed by diffusion in a surface layer of semiconductor substrate 31. Furthermore, MOSFET 10 includes gate oxide film 11a formed on a surface of semiconductor substrate 31, and gate 11 formed of polysilicon layer 33. Furthermore, MOSFET 10 includes dielectric 35 and interlayer dielectric 43 formed so as to cover gate 11, metal wiring 77 connected to drain 12, and metal wiring 78 connected to source 13.

The invention is such that all of protection circuit 17 configured of protection diode 7 and protection resistor 6 is formed of polysilicon layer 36, and configured by being deposited on polysilicon layer 33 forming fuse resistor 3. According to this kind of configuration, the portion A of trimming circuit 100 of FIG. 1 is realized with a smaller area than that of the portion A of FIG. 4. The example of FIGS. 5A to 5D is such that terminals of protection resistor 6 and protection diode 7 are commonalized, and each diffusion region is formed of polysilicon layer 36, but each diffusion region may be formed of a separate polysilicon layer, and connected with metal wiring.

In the example of FIGS. 5(a) to 5(d), the area of protection circuit 17 (polysilicon protection element) configured of protection diode 7 and protection resistor 6 is reduced, because of which the diffusion regions are formed by ion implantation with little lateral diffusion. However, the diffusion regions may also be formed by vapor-phase diffusion.

In the example of FIGS. 5(a) to 5(d), protection resistor 6 is of an n+/n−/n+ configuration and protection diode 7 is of an n+/n—/p+ configuration, but the concentration of the diffusion regions of each element is not limited thereby.

In the example of FIGS. 5(a) to 5(d), the whole of polysilicon layer 33 except for contact portion 34 is covered by polysilicon layer 36, but polysilicon layer 36 may also partially overlap polysilicon layer 33.

In the example of FIGS. 5(a) to 5(d), dielectric 35 between polysilicon layer 33 and polysilicon layer 36 is a high temperature oxide (HTO), but dielectric 35 is not limited to this. Also, the form of fuse resistor 3 of polysilicon layer 33, and the forms of protection resistor 6 and protection diode 7 of polysilicon layer 36, are not limited to the examples shown in FIGS. 5(a) to 5(d).

By adopting a two layer structure for trimming circuit 100, it is possible to reduce the area occupied by trimming circuit 100. Also, it is possible to reduce the area occupied by semiconductor device 300 having trimming circuit 100, and thus it is possible to reduce the cost.

By forming fuse resistor 3, protection resistor 6, and protection diode 7, but not MOSFET 10, on dielectric 32 (LOCOS oxide film), it is possible to suppress parasitic malfunction of other elements (devices) formed in semiconductor substrate 31 when a trimming voltage is applied.

Example 4

Figure 8A:
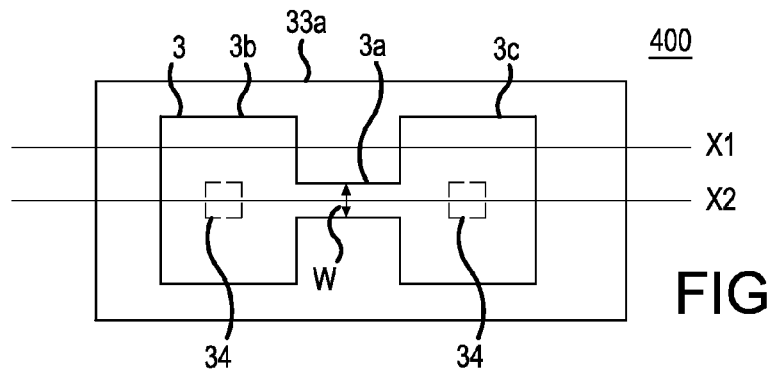
Figure 8B:
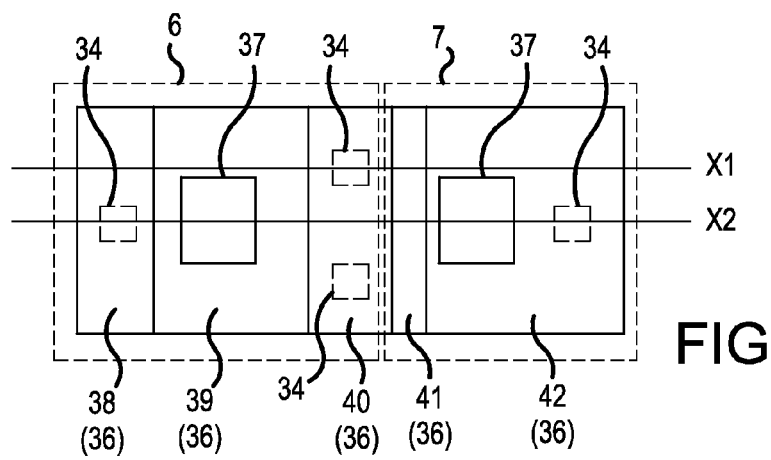
Figure 8C:
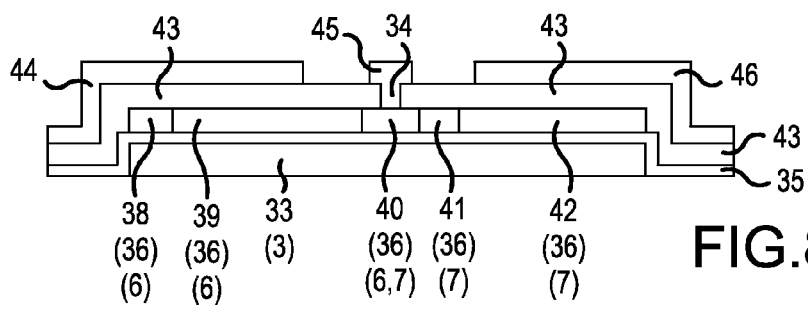
Figure 8D:
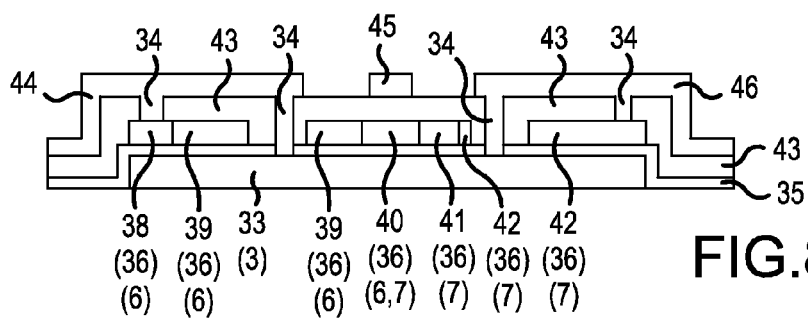

FIGS. 8(a) to 8(d) are main portion configuration diagrams of semiconductor device 400 according to a fourth example of the invention, wherein FIG. 8(a) is a plan view of the fuse resistor, FIG. 8(b) is a plan view of the protection diode and protection resistor, FIG. 8(c) is a sectional view cut along an X1-X1 line of FIGS. 8(a) and 8(b), and FIG. 8(d) is a sectional view cut along an X2-X2 line of FIGS. 8(a) and 8(b). The drawings are main portion plan views and main portion sectional views of the portion A of trimming circuit 100 shown in FIG. 1.

A difference from semiconductor device 300 of FIGS. 5(a) to 5(d) is that fuse resistor 3 is formed with a form the same as that in FIGS. 5(a) to 5(d) by impurities being selectively ion implanted, using a mask, into polysilicon layer 33a, formed of non-doped polysilicon, formed separately from gate 11 of MOSFET 10. The size of polysilicon layer 33a is equal to or greater than the size of polysilicon layer 36. Because of this, no unevenness is formed in a central portion of polysilicon layer 36, and it is thus unlikely that polysilicon layer 36 or second metal wiring 45 will be disconnected in an uneven portion.

In Examples 3 and 4, the same advantages are also obtained when forming trimming circuit 100 with first layer polysilicon layers 33 and 33a and second layer polysilicon layer 36 interchanged. In the following examples, a description will be given of a case wherein polysilicon layer 36 is formed on the first layer and polysilicon layers 33 and 33a are formed on the second layer.

Example 5

Figure 9A:
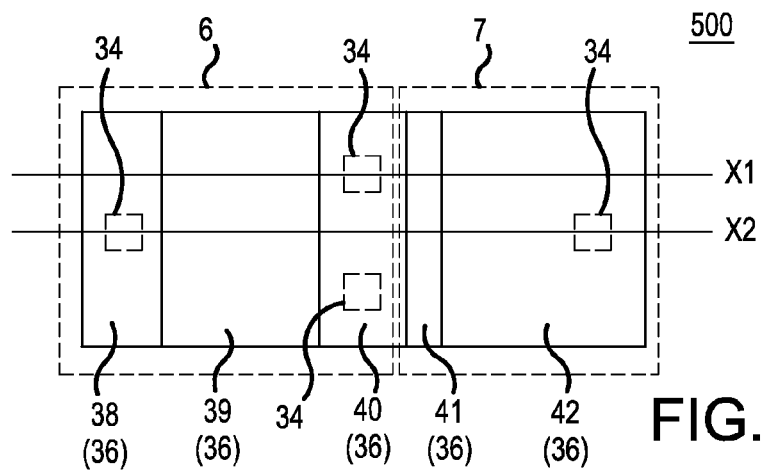
Figure 9B:
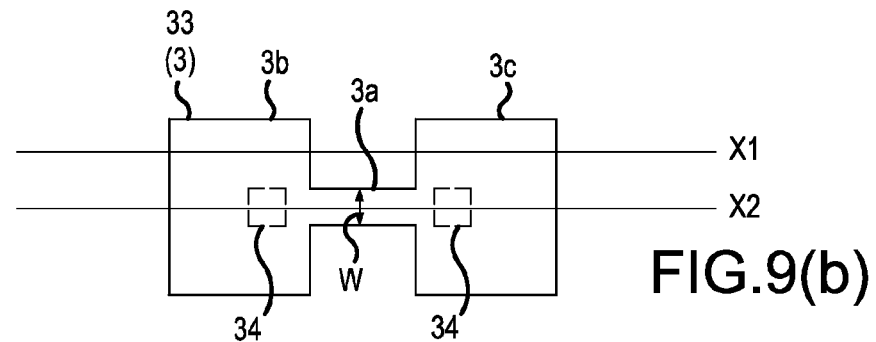
Figure 9C:
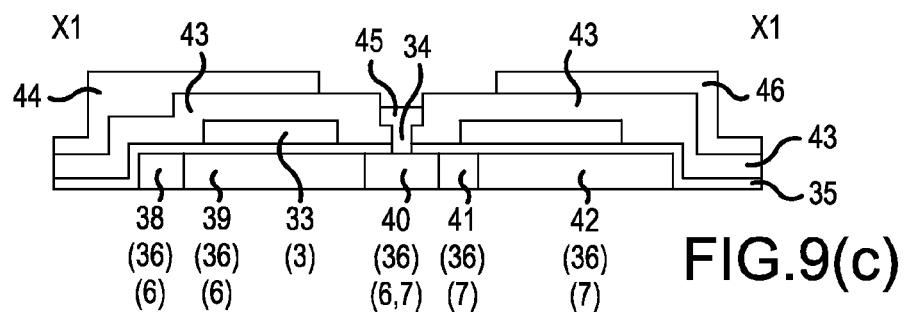
Figure 9D:
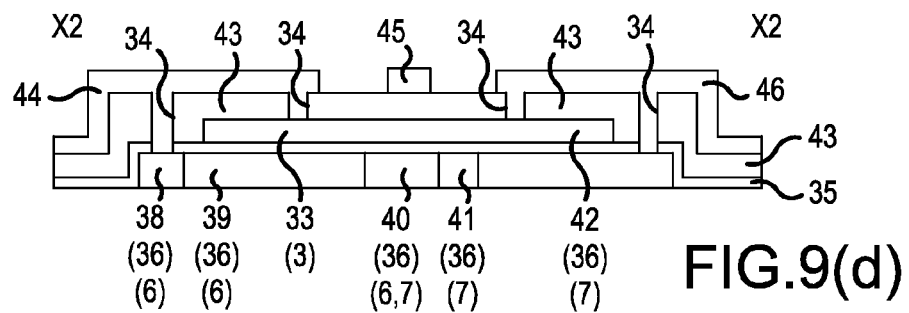

FIGS. 9(a) to 9(d) are main portion configuration diagrams of semiconductor device 500 according to a fifth example of the invention, wherein FIG. 9(a) is a plan view of the protection diode and protection resistor, FIG. 9(b) is a plan view of the fuse resistor, FIG. 9(c) is a sectional view cut along an X1-X1 line of FIGS. 9(a) and 9(b), and FIG. 9(d) is a sectional view cut along an X2-X2 line of FIGS. 9(a) and 9(b). The drawings are main portion plan views and main portion sectional views of the portion A of trimming circuit 100 shown in FIG. 1.

The example is such that fuse resistor 3 is formed of a doped polysilicon and protection resistor 6 and protection diode 7 are formed by impurities being ion implanted into polysilicon layer 36, in the same way as in FIGS. 5(a) to 5(d). A difference from FIGS. 5(a) to 5(d) is that polysilicon layer 33 is formed across a dielectric on polysilicon layer 36. Also, aperture portion 37 is not formed in polysilicon layer 36.

First metal wiring 44 is disposed on one of contact portions 34 formed in interlayer dielectric 43, and thus connected to one terminal of fuse resistor 3 of polysilicon layer 33, as shown in FIG. 9(d). Furthermore, first metal wiring 44 is disposed on another contact portion 34 formed in interlayer dielectric 43 and dielectric 35, and thus connected to first n+ type diffusion region 38, which is one terminal of protection resistor 6 of polysilicon layer 36.

Second metal wiring 45 is disposed on one of contact portions 34 formed in interlayer dielectric 43 and dielectric 35, and thus connected to second n+ type diffusion region 40 of polysilicon layer 36, as shown in FIG. 9(c). Contact portion 34 for connecting second metal wiring 45 and second n+ type diffusion region 40 is disposed avoiding the region above fusion portion 3a of fuse resistor 3.

Third metal wiring 46 is disposed on one of contact portions 34 formed in interlayer dielectric 43, and thus connected to the other terminal of fuse resistor 3 of polysilicon layer 33, as shown in FIG. 9(d). Furthermore, third metal wiring 46 is disposed on another contact portion 34 formed in interlayer dielectric 43 and dielectric 35, and thus connected to p+ type diffusion region 42, which is anode 9 of protection diode 7 of polysilicon layer 36.

Example 6

Figure 10A:
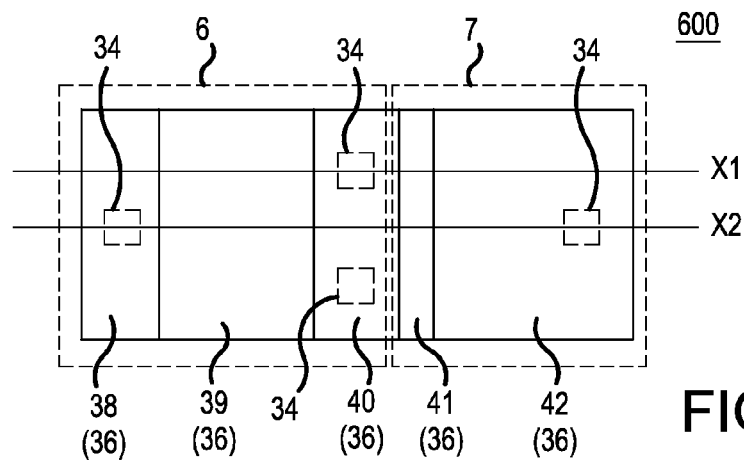
Figure 10B:
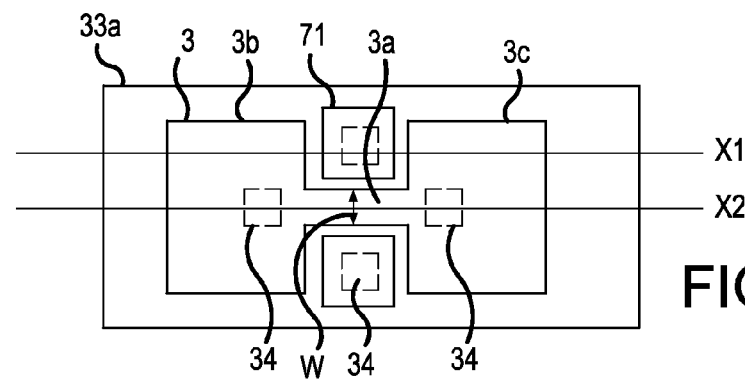
Figure 10C:
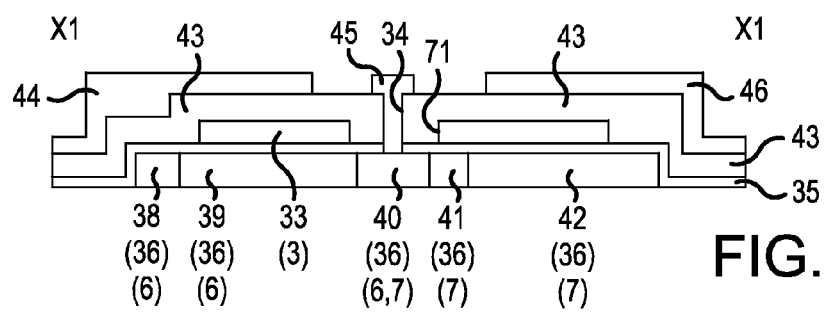
Figure 10D:
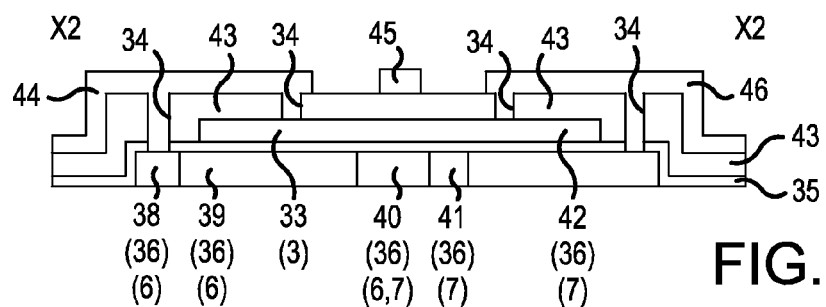

FIGS. 10(a) to 10(d) are main portion configuration diagrams of semiconductor device 600 according to a sixth example of the invention, wherein FIG. 10(a) is a plan view of the protection diode and protection resistor, FIG. 10(b) is a plan view of the fuse resistor, FIG. 10C is a sectional view cut along an X1-X1 line of FIGS. 10(a) and 10(b), and FIG. 10(d) is a sectional view cut along an X2-X2 line of FIGS. 10(a) and 10(b). The drawings are main portion plan views and main portion sectional views of the portion A of trimming circuit 100 shown in FIG. 1.

The example is such that fuse resistor 3 is formed by impurities being ion implanted into polysilicon layer 33a, which is formed of a non-doped polysilicon, and protection resistor 6 and protection diode 7 are formed by impurities being ion implanted into polysilicon layer 36, in the same way as in FIGS. 8(a) to 8(d). A difference from FIGS. 8(a) to 8(d) is that polysilicon layer 33a is formed across a dielectric on polysilicon layer 36. By polysilicon layer 33a being formed on the second layer, aperture portion 71 through which dielectric 35 is exposed is formed in polysilicon layer 33a.

First metal wiring 44 is disposed on one of contact portions 34 formed in interlayer dielectric 43, and thus connected to one terminal of fuse resistor 3 of polysilicon layer 33a, as shown in FIG. 10(d). Furthermore, first metal wiring 44 is disposed on another contact portion 34 formed in interlayer dielectric 43 and dielectric 35, and thus connected to first n+ type diffusion region 38, which is one terminal of protection resistor 6 of polysilicon layer 36.

Second metal wiring 45 is disposed on one of contact portions 34 formed in interlayer dielectric 43 and dielectric 35 in the interior of aperture portion 71, and thus connected to second n+ type diffusion region 40 of polysilicon layer 36, as shown in FIG. 10(c). Contact portion 34 for connecting second metal wiring 45 and second n+ type diffusion region 40 is disposed avoiding the region above fusion portion 3a of fuse resistor 3.

Third metal wiring 46 is disposed on one of the contact portions 34 formed in interlayer dielectric 43, and thus connected to the other terminal of fuse resistor 3 of polysilicon layer 33a, as shown in FIG. 10(d). Furthermore, third metal wiring 46 is disposed on another contact portion 34 formed in interlayer dielectric 43 and dielectric 35, and thus connected to p+ type diffusion region 42, which is anode 9 of protection diode 7 of polysilicon layer 36.

Figure 11:
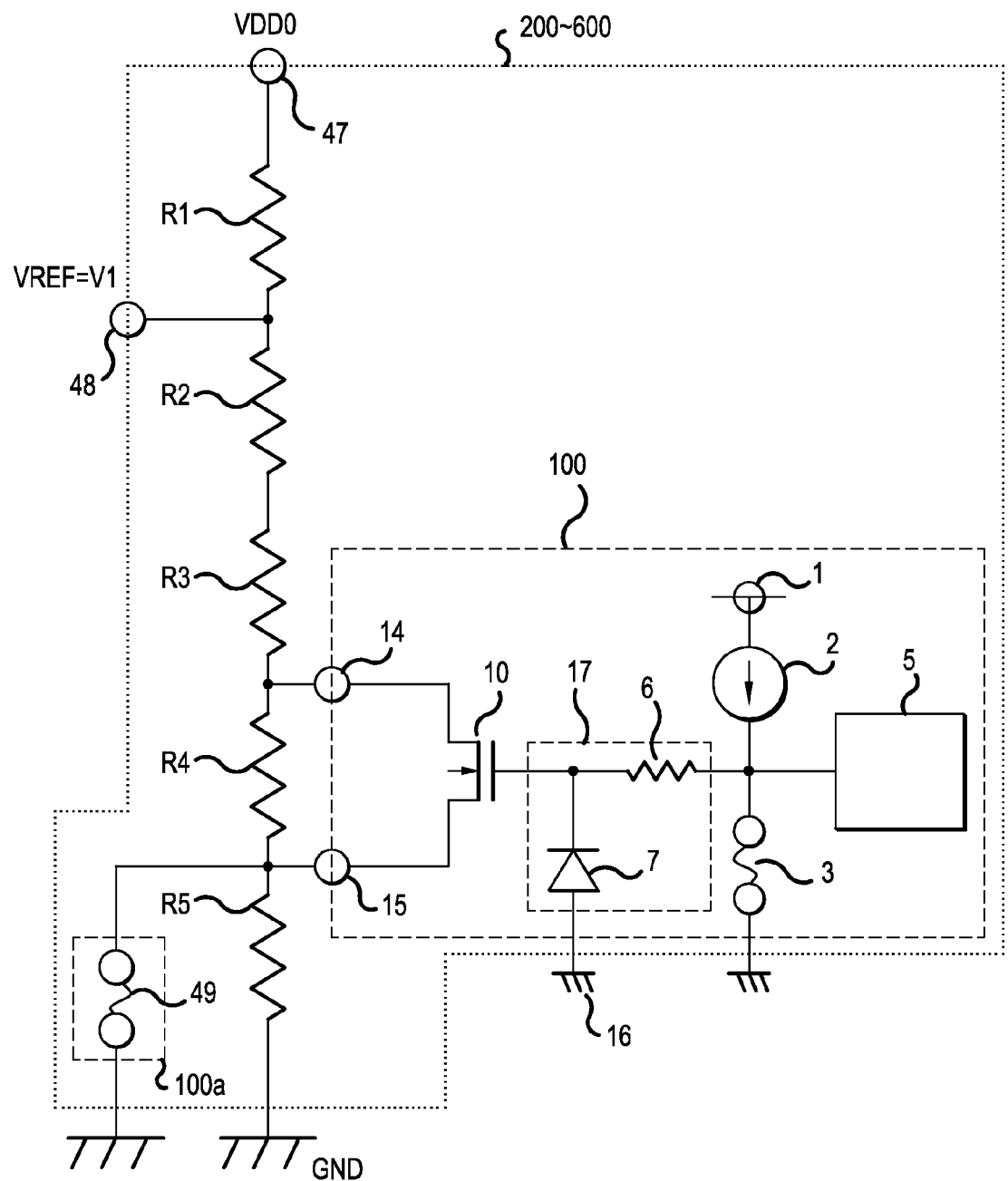
FIG. 11 is a main portion circuit diagram of the semiconductor device including the trimming circuit formed of a fuse resistor and MOSFET and a trimming circuit formed of only a fuse resistor.
Figure 12A:
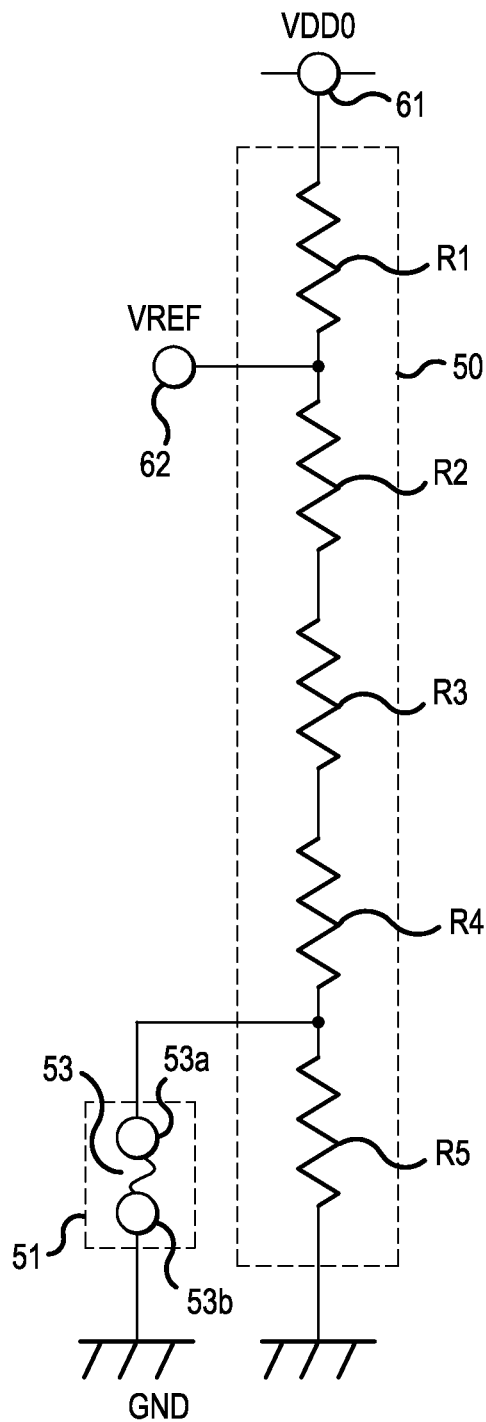
Figure 12B:
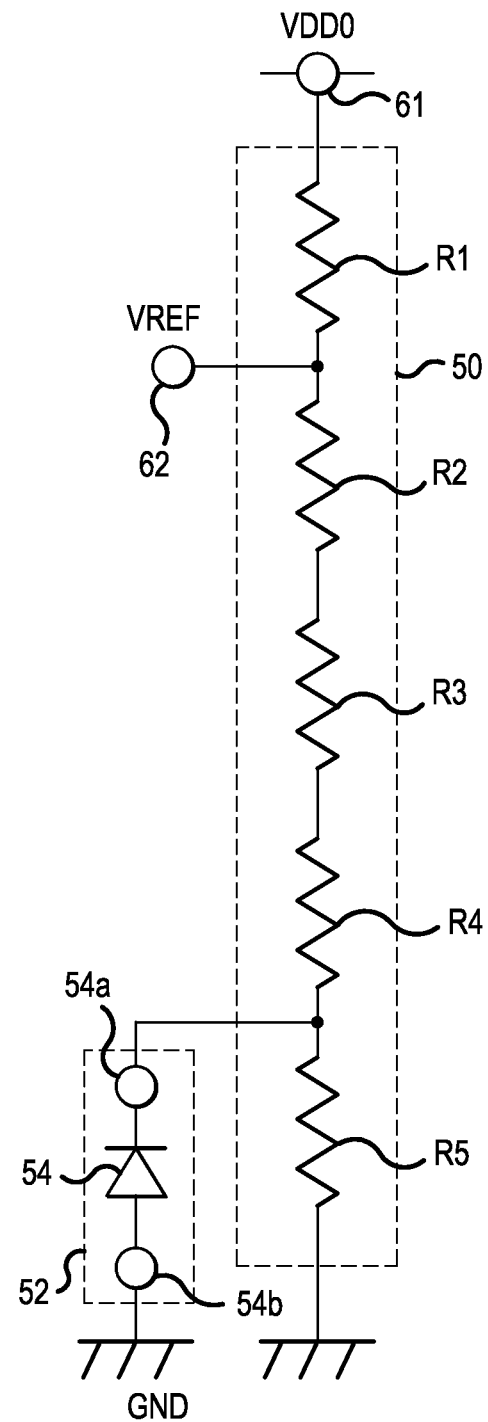

FIG. 11 is a main portion circuit diagram of the semiconductor devices 200 to 600 including trimming circuit 100 and trimming circuit 100a formed of only fuse resistor 49. A description will be given, using the diagram, of an operation of trimming circuits 100 and 100a.

For example, one end of a series resistor circuit configured of five resistors R1 to R5 is connected to power supply terminal 47, the other end is connected to the ground, and a reference voltage VREF is output from a connection point of the uppermost stage resistor R1 and second stage resistor R2. Trimming circuit 100a is connected in parallel with fifth stage resistor R5, and first terminal 14 and second terminal 15 of trimming circuit 100 are connected one to either end of the fourth stage resistor R4. The design is such that when a power supply voltage VDD0 is applied to power supply terminal 47, the reference voltage VREF=V1 is output from reference voltage terminal 48.

When the manufacturing process is finished, VDD0 is applied to power supply terminal 47, the reference voltage VREF of reference voltage terminal 48 is measured, and a voltage lower than V1 is indicated, fuse resistor 49 of trimming circuit 100a is fused. By fuse resistor 49 being fused, the previously short circuited R5 recovers, and the reference voltage VREF increases. By VREF increasing, VREF nears V1, which is the set voltage, and is thus adjusted.

Meanwhile, when the manufacturing process is finished, VDD0 is applied to power supply terminal 47, the reference voltage VREF is measured, and a voltage higher than V1 is indicated, fuse resistor 3 of trimming circuit 100 is fused. By fuse resistor 3 being fused, MOSFET 10 changes to an on-state, and there is a short circuit state between first terminal 14 and second terminal 15. The reference voltage VREF increases as a result of this, and by VREF increasing, VREF nears V1, which is the set voltage, and is thus adjusted.

In this way, by using both trimming circuit 100*a* formed of only fuse resistor 49 and trimming circuit 100 formed of fuse resistor 3 and MOSFET 10, it is possible to carry out two kinds of state trimming, trimming from a short circuit state to an open circuit state and trimming from an open circuit state to a short circuit state, just by fusing fuse resistors 3 and 49. Because of this, as one power supply voltage applying voltage to trimming pad 5 is sufficient, it is possible to reduce the size of the whole integrated circuit by, for example, using the internal power supply voltage of trimming circuit 100*a* in trimming circuit 100.

Also, as it is possible to form MOSFET 10 configuring trimming circuit 100 simultaneously with other MOSFETs configuring the semiconductor devices 200 to 600, it is possible to reduce the manufacturing cost compared with when configuring the trimming circuit with a Zener zap diode.

Also, as protection circuit 17 is included, no high voltage is applied to gate 11 of MOSFET 10 configuring trimming circuit 100, and it is thus possible to prevent dielectric breakdown of the gate dielectric of MOSFET 10.

In semiconductor devices 200 to 600 of Examples 2 to 6, constant current circuit 2 configuring trimming circuit 100 is formed in semiconductor substrate 31 in the case of, for example, a depletion MOSFET. Also, MOSFET 10 configuring trimming circuit 100 is also formed in semiconductor substrate 31.

Thus, semiconductor devices and methods for their manufacture have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A semiconductor device comprising a trimming circuit including:
    a constant current circuit;
    a fuse resistor, one end of which is connected to the constant current circuit;
    a trimming pad connected to a connection point connecting the constant current circuit and the one end of the fuse resistor;
    a protection resistor of which one end is connected to the connection point;
    a protection diode, a cathode of which is connected to the other end of the protection resistor;
    a MOS transistor, a gate of which is connected to the other end of the protection resistor; and
    a ground to which are connected the other end of the fuse resistor and an anode of the protection diode, wherein
    the fuse resistor, protection resistor, and protection diode are formed of a polysilicon layer disposed across a first dielectric on a semiconductor substrate,
    wherein a first layer polysilicon layer in which the fuse resistor is formed is disposed on the first dielectric, a second layer polysilicon layer in which the protection resistor and protection diode are formed is disposed across a second dielectric on the first layer polysilicon layer, and a third dielectric is disposed on the second layer polysilicon layer.

2. The semiconductor device according to claim 1, wherein the fuse resistor is selectively formed in the first layer polysilicon layer.

3. The semiconductor device according to claim 1, wherein an end portion of the protection resistor includes a common region that doubles as a cathode region of the protection diode.

4. The semiconductor device according to claim 1, additionally comprising:
    a first aperture portion, formed in the protection resistor, through which passes a first metal wiring for connecting the fuse resistor and protection resistor; and
    a second aperture portion, formed in the anode region of the protection diode, through which passes a third metal wiring for connecting the fuse resistor and protection diode.

5. The semiconductor device according to claim 4, wherein
    the third dielectric is disposed in the first aperture portion and second aperture portion,
    the first metal wiring is disposed on a first contact portion formed in the third dielectric and second dielectric in the interior of the first aperture portion, and
    the third metal wiring is disposed on a second contact portion formed in the third dielectric and second dielectric in the interior of the second aperture portion.

6. The semiconductor device according to claim 1, wherein
    the fuse resistor includes a fusion portion and first and second contact regions, disposed on either side of the fusion portion, with a width greater than the width of the fusion portion,
    the common region is formed on the second dielectric from a portion above the fusion portion to a region between the first contact region and second contact region in which the fusion portion is not formed, and includes a second metal wiring that connects the gate of the MOS transistor and the common region, and
    the common region and second metal wiring are connected in the region between the first contact region and second contact region in which the fusion portion is not formed.

7. A semiconductor device comprising a trimming circuit including:
    a constant current circuit;
    a fuse resistor, one end of which is connected to the constant current circuit;
    a trimming pad connected to a connection point connecting the constant current circuit and the one end of the fuse resistor;
    a protection resistor of which one end is connected to the connection point;
    a protection diode, a cathode of which is connected to the other end of the protection resistor;
    a MOS transistor, a gate of which is connected to the other end of the protection resistor; and
    a ground to which are connected the other end of the fuse resistor and an anode of the protection diode, wherein
    the fuse resistor, protection resistor, and protection diode are formed of a polysilicon layer disposed across a first dielectric on a semiconductor substrate,
    wherein a first layer polysilicon layer in which the protection resistor and protection diode are formed is disposed on the first dielectric, and a second layer polysilicon layer in which the fuse resistor is formed is disposed across a second dielectric on the first layer polysilicon layer.

8. The semiconductor device according to claim 2, wherein the size of the first layer polysilicon layer is equal to or greater than the size of the second layer polysilicon layer.

9. The semiconductor device according to claim 2, wherein an end portion of the protection resistor includes a common region that doubles as a cathode region of the protection diode.

* * * * *